United States Patent
Han et al.

(10) Patent No.: US 12,176,185 B2
(45) Date of Patent: Dec. 24, 2024

(54) APPARATUS AND METHOD FOR PROCESSING SUBSTRATE USING PLASMA

(71) Applicant: SEMES CO., LTD., Chungcheongnam-do (KR)

(72) Inventors: Min Sung Han, Gyeonggi-do (KR); Jae Hoo Lee, Gyeonggi-do (KR); Yoon Jong Ju, Gyeonggi-do (KR); Wan Jae Park, Gyeonggi-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 342 days.

(21) Appl. No.: 17/712,055

(22) Filed: Apr. 1, 2022

(65) Prior Publication Data
US 2023/0317417 A1 Oct. 5, 2023

(51) Int. Cl.
*H01J 37/32* (2006.01)
*H01L 21/311* (2006.01)

(52) U.S. Cl.
CPC .... *H01J 37/3244* (2013.01); *H01J 37/32422* (2013.01); *H01J 37/32477* (2013.01); *H01J 37/32522* (2013.01); *H01J 2237/334* (2013.01); *H01L 21/31116* (2013.01)

(58) Field of Classification Search
CPC ............ H01J 37/32477; H01J 37/3244; H01J 37/32522; H01J 2237/334; H01L 21/31116
See application file for complete search history.

(56) References Cited

U.S. PATENT DOCUMENTS

2005/0000423 A1* 1/2005 Kasai ................. H01J 37/3244
257/E21.17
2021/0098232 A1* 4/2021 An ...................... H01L 21/3065

FOREIGN PATENT DOCUMENTS

| KR | 10-1807567     | 12/2017 |
|----|----------------|---------|
| KR | 10-2019-0108173| 9/2019  |
| KR | 10-2019-0117247| 10/2019 |
| KR | 10-2020-0089340| 7/2020  |

OTHER PUBLICATIONS

Office Action dated Apr. 4, 2023 for Korean Patent Application No. 10-2020-0179966 and its English translation from Global Dossier.

* cited by examiner

*Primary Examiner* — Yuechan Yu
(74) *Attorney, Agent, or Firm* — Womble Bond Dickinson (US) LLP (57) ABSTRACT

Provided are a substrate processing apparatus and method for increasing the uniformity of substrate processing. The substrate processing apparatus comprises a first space disposed between an electrode and an ion blocker, a second space disposed between the ion blocker and a shower head, and a processing space for processing a substrate under the shower head, wherein the ion blocker includes a first region and a second region that are separated from each other, and includes a plurality of first supply ports for supplying a first reaction gas to the second space, wherein the plurality of first supply ports are formed in the first region and not formed in the second region, wherein the shower head includes a third region corresponding to the first region, a fourth region corresponding to the second region, and a plurality of second supply ports for supplying a second reaction gas to the second space, wherein the plurality of second supply ports are not formed in the third region, and are formed in the fourth region.

19 Claims, 9 Drawing Sheets

APPARATUS AND METHOD FOR PROCESSING SUBSTRATE USING PLASMA

BACKGROUND

1. Field

The present disclosure relates to a substrate processing apparatus and method using plasma.

2. Description of the Related Art

When manufacturing a semiconductor device or a display device, a substrate processing process using plasma may be used. A substrate processing process using plasma includes a capacitively coupled plasma (CCP) method, an inductively coupled plasma (ICP) method, and a method in which the two are mixed according to a method of generating plasma. In addition, dry cleaning or dry etching may be performed using plasma.

SUMMARY

On the other hand, for dry cleaning of the substrate, a plasma effluent (i.e., radicals) is provided in the processing space. In addition, in order to increase the efficiency of dry cleaning, a reaction gas for generating an etchant by reacting with radicals is provided in the processing space. If the reaction gas is non-uniformly supplied to the processing space, uniformity of substrate processing is deteriorated.

An object of the present disclosure is to provide a substrate processing apparatus and method for increasing the uniformity of substrate processing.

The object of the present disclosure is not limited to the objects mentioned above, and other objects not mentioned will be clearly understood by those skilled in the art from the following description.

One aspect of the substrate processing apparatus of the present disclosure for achieving the above object comprises a first space disposed between an electrode and an ion blocker; a second space disposed between the ion blocker and a shower head; and a processing space for processing a substrate under the shower head, wherein the ion blocker includes a first region and a second region that are separated from each other, and includes a plurality of first supply ports for supplying a first reaction gas to the second space, wherein the plurality of first supply ports are formed in the first region and not formed in the second region, wherein the shower head includes a third region corresponding to the first region, a fourth region corresponding to the second region, and a plurality of second supply ports for supplying a second reaction gas to the second space, wherein the plurality of second supply ports are not formed in the third region, and are formed in the fourth region.

Another aspect of the substrate processing apparatus of the present disclosure for achieving the above object comprises a first space disposed between an electrode and an ion blocker; a second space disposed between the ion blocker and a shower head; and a processing space for processing a substrate under the shower head, wherein a first reaction gas supply chamber connected to a plurality of first supply ports for supplying a first reaction gas to the second space is installed in a center region of the ion blocker, wherein a second reaction gas supply chamber connected to a plurality of second supply ports for supplying a second reaction gas to the second space is installed in an edge region of the shower head, wherein a heater ring disposed between the ion blocker and the shower head, and surrounding the second space is installed, wherein the first reaction gas supply chamber is connected to a plurality of first supply paths for receiving the first reaction gas, wherein the second reaction gas supply chamber is connected to a plurality of second supply paths for receiving the second reaction gas.

Another aspect of the substrate processing apparatus of the present disclosure for achieving the above object comprises a first space disposed between an electrode and the ion blocker; a second space disposed between the ion blocker and a shower head; a processing space for processing a substrate under the shower head; a first gas supply module for providing a process gas for generating plasma to the first space through the electrode; a second gas supply module for providing a first reaction gas to the second space through the ion blocker; and a third gas supply module for providing a second reaction gas to the second space through the shower head.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Figure 1:
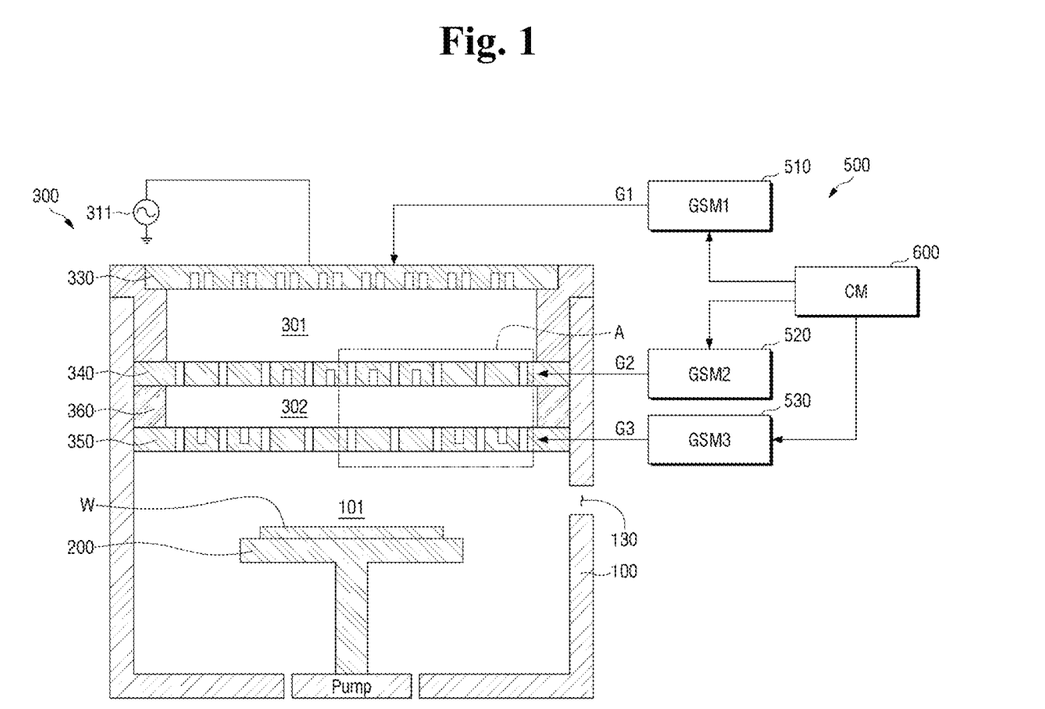
FIG. 1 is a conceptual diagram for describing a substrate processing apparatus according to some embodiments of the present disclosure.
Figure 2:
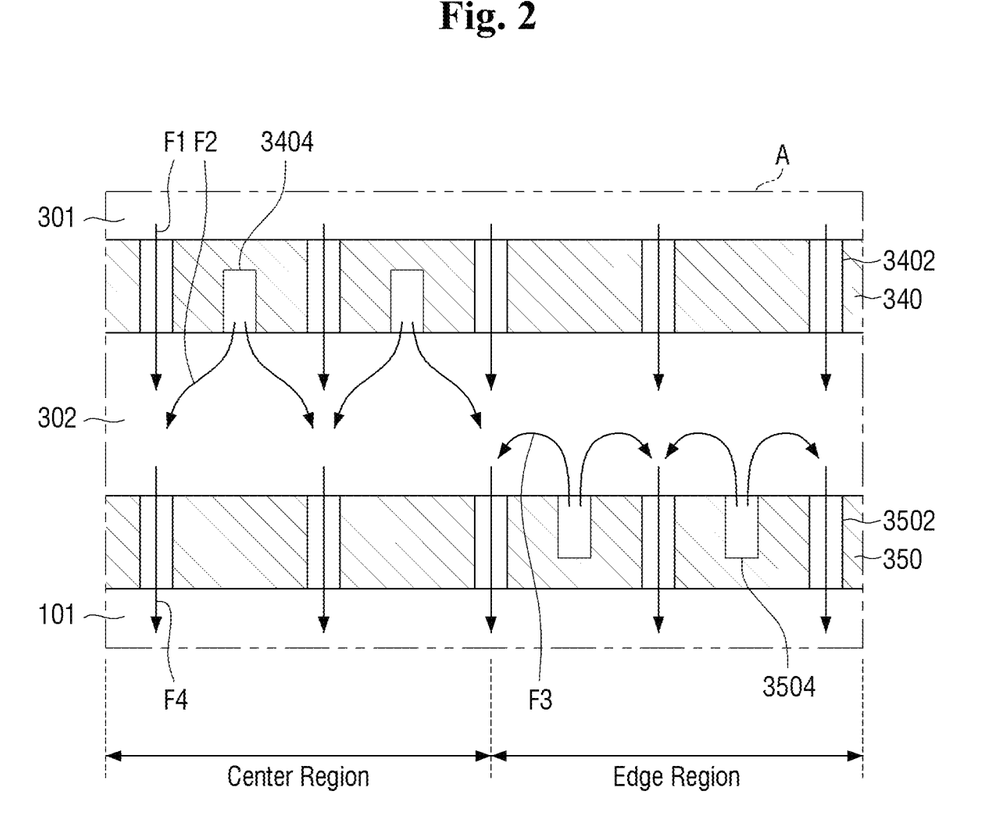
FIG. 2 is an enlarged view of region A of FIG. 1.
Figure 3:
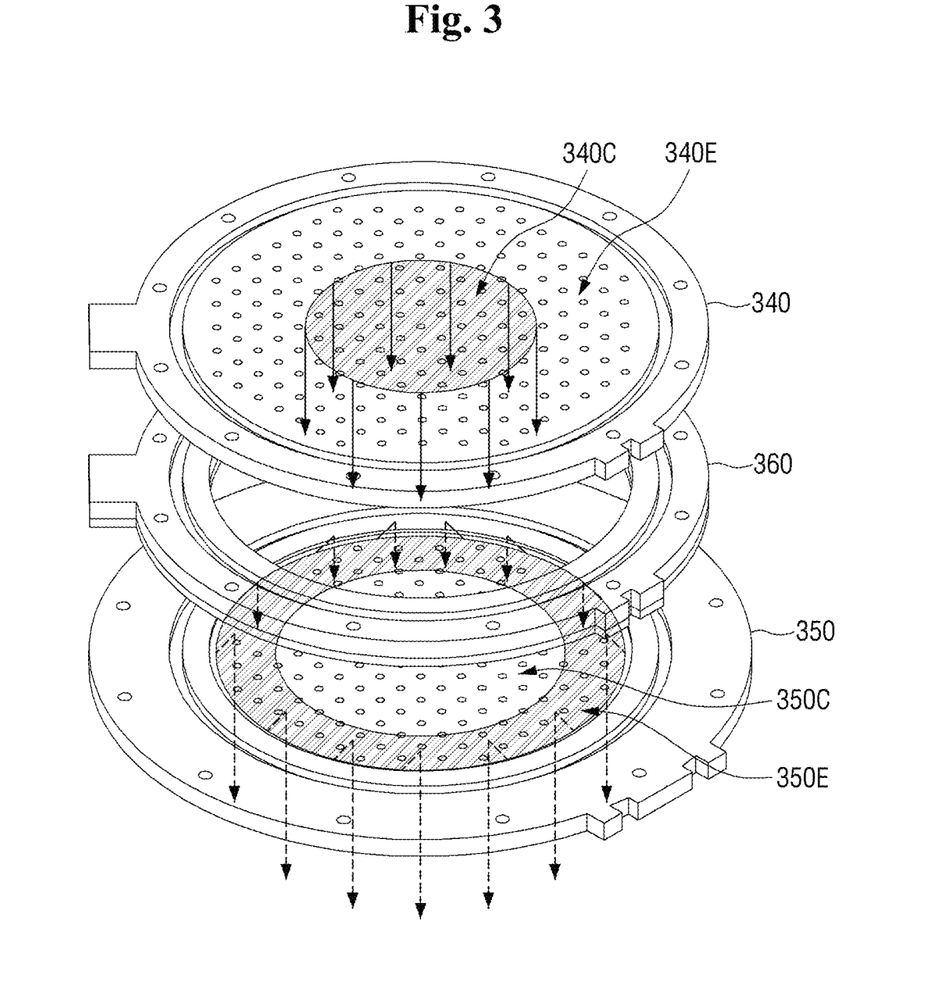
FIG. 3 is a perspective view illustrating an ion blocker, a heater ring, and a shower head of FIG. 1.
Figure 4:
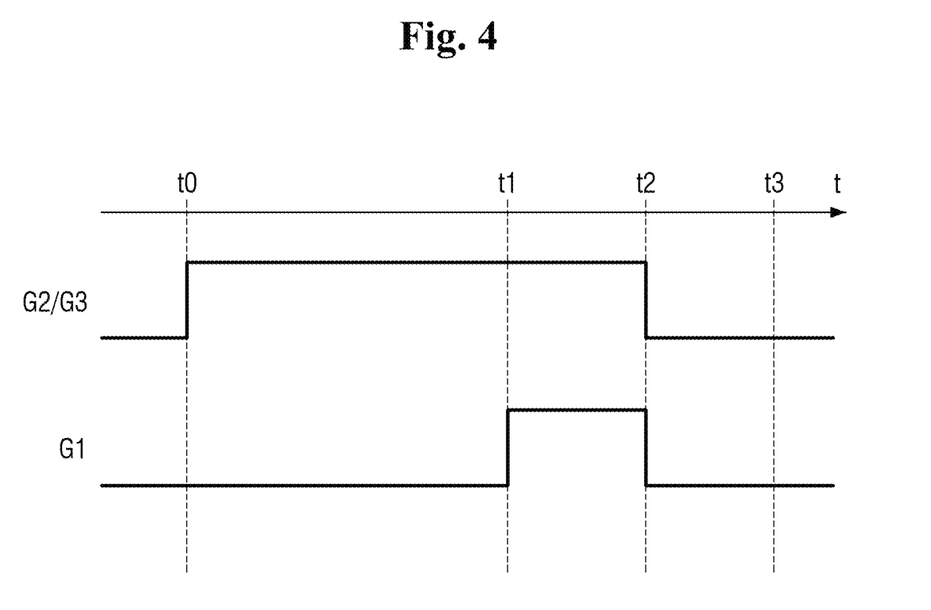
FIG. 4 is a view for describing a substrate processing method according to some embodiments of the present disclosure.

FIG. 1 is a conceptual diagram for describing a substrate processing apparatus according to some embodiments of the present disclosure. FIG. 2 is an enlarged view of region A of FIG. 1. FIG. 3 is a perspective view illustrating an ion blocker, a heater ring, and a shower head of FIG. 1. FIG. 4 is a view for describing a substrate processing method according to some embodiments of the present disclosure.

First, referring to FIGS. 1 to 3, a substrate processing apparatus according to some embodiments of the present disclosure includes a process chamber 100, a support module 200, an electrode module 300, a gas supply module 500, a control module 600 and the like.

The process chamber 100 provides a processing space 101, in which the substrate W is processed. The process chamber 100 may have a circular cylindrical shape. The process chamber 100 is provided with a metal material. For example, the process chamber 100 may be provided with an aluminum material. An opening 130 is formed in one sidewall of the process chamber 100. The opening 130 is used as an entrance, through which the substrate W can be carried in and out. The entrance can be opened and closed by a door. An exhaust port (not shown) is installed on the bottom surface of the process chamber 100. The exhaust port functions as an outlet, through which by-products generated in the processing space 101 are discharged to the outside of the process chamber 100.

The support module 200 is installed in the processing space 101 and supports the substrate W. The support module 200 may be an electrostatic chuck that supports the substrate W using an electrostatic force, but is not limited thereto. The electrostatic chuck may comprise a dielectric plate, on which the substrate W may be placed, an electrode installed in the dielectric plate and providing electrostatic force so that the substrate W is adsorbed to the dielectric plate, and a heater installed in the dielectric plate and heating the substrate W to control the temperature of the substrate W.

The electrode module 300 includes an electrode (or upper electrode) 330, an ion blocker 340, a shower head 350, a heater ring 360, and the like, and serves as a capacitively coupled plasma source. The gas supply module 500 includes a process gas supply module 510, a first reaction gas supply module 520, and a second reaction gas supply module 530. The control module 600 controls gas supply of the gas supply modules 510, 520, and 530.

A first space (i.e., a plasma generating space) 301 is disposed between the electrode 330 and the ion blocker 340, and a second space 302 is disposed between the ion blocker 340 and the shower head 350. The processing space 101 is located under the shower head 350.

The electrode 330 may be connected to a high frequency power supply 311, and the ion blocker 340 may be connected to a constant voltage (e.g., a ground voltage). The electrode 330 includes a plurality of supply holes. The process gas supply module 510 provides the process gas G1 to the first space 301 through the electrode 330 (i.e., the supply hole of the electrode 330). The electromagnetic field generated between the electrode 330 and the ion blocker 340 excites the process gas G1 into a plasma state. The process gas excited into a plasma state (i.e., plasma effluent) contains radicals, ions and/or electrons. The process gas G1 may vary depending on the target material. The target material may be, for example, silicon oxide formed on the substrate W. In this case, the process gas G1 may be nitrogen trifluoride ($NF_3$), and may further include an inert gas (e.g., He).

The ion blocker 340 is formed of a conductive material, and may have, for example, a plate shape such as a disk. The ion blocker 340 may be connected to a constant voltage, but is not limited thereto. The ion blocker 340 includes a plurality of first through-holes (see 3402 of FIG. 2) formed in the vertical direction. Radicals or uncharged neutral species in the plasma effluent may pass through the first through hole 3402 of the ion blocker 340. On the other hand, it is difficult for charged species (i.e., ions) to pass through the first through hole 3402 of the ion blocker 340. When the process gas G1 is nitrogen trifluoride ($NF_3$), fluorine-containing radicals ($F^*$, $NF_3^*$, etc.) may pass through the ion blocker 340.

A plurality of first supply ports 3404 for supplying the first reaction gas G2 to the second space 302 are formed in the ion blocker 340. The plurality of first supply ports 3404 may not be formed on the entire surface of the ion blocker 340, but may be formed only in a partial region. As shown in FIG. 3, the ion blocker 340 includes a first region 340C and a second region 340E that are separated from each other. The second region 340E may be formed to surround the first region 340C. The first region 340C may be a center region, and the second region 340E may be an edge region. The plurality of first supply ports 3404 are formed in any one region (e.g., 340C) of the first region 340C and the second region 340E, and are not formed in the other region (e.g., 340E).

The shower head 350 may be formed of a conductive material and may have, for example, a plate shape such as a disk. The shower head 350 may be connected to a constant voltage, but is not limited thereto. The shower head 350 includes a plurality of second through holes (see 3502 of FIG. 2) formed in the vertical direction.

A plurality of second supply ports 3504 for supplying the second reaction gas G3 to the second space 302 are formed in the shower head 350. The plurality of second supply ports 3504 may not be formed on the entire surface of the shower head 350, but may be formed only in a partial region. As shown in FIG. 3, the shower head 350 includes a third region 350C and a fourth region 350E that are separated from each other. The fourth region 350E may be formed to surround the third region 350C, but is not limited thereto. The third region 350C may be a center region, and the fourth region 350E may be an edge region.

The third region 350C of the shower head 350 corresponds to the first region 340C of the ion blocker 340. The fourth region 350E of the shower head 350 corresponds to the second region 350E of the ion blocker 340.

As shown, the plurality of second supply ports 3504 are formed in any one region (e.g., 350E) of the third region 350C and the fourth region 350E, and are not formed in the other region (e.g., 350E).

As illustrated, if the first supply port 3404 is formed in the first region 340C of the ion blocker 340, the second supply port 3404 is not formed in the third region 350C that corresponds to the first region 340C, and the second supply port 3504 is formed in the fourth region 350E that does not correspond to the first region 340C.

Unlike the illustration, if the first supply port 3404 is formed in the second region 340E of the ion blocker 340, the second supply port 3404 is not formed in the fourth region 350E that corresponds to the second region 340E, and the second supply port 3504 is formed in the third region 350C that does not correspond to the second region 340E.

The first reaction gas G2 and the second reaction gas G3 may vary depending on the target material and the type of the process gas G1. When the target material is silicon oxide and the process gas G1 is nitrogen trifluoride ($NF_3$), the first reaction gas G2 and the second reaction gas G3 may be ammonia gas ($NH_3$), and additionally an auxiliary gas (e.g., nitrogen gas ($N_2$) or inert gas (He)) may be further included. The first reaction gas G2 and the second reaction gas G3 may be the same type of gas, or different types of gases depending on the design. The first reaction gas G2 and the second reaction gas G3 are provided to the processing space 101 in an unexcited state (i.e., in a non-plasma state).

On the other hand, in the second space 302, radicals (e.g., fluorine-containing radicals (F*, $NF_3$*, etc.)) that have passed through the ion blocker 340 (see the reference numeral F1 in FIG. 2), the first reaction gas G2 (e.g., ammonia gas) provided through the first supply port 3404 of the ion block 340 (see reference numeral F2 in FIG. 2), and the second reaction gas G2 (e.g., ammonia gas) provided through the second supply port 3504 of the shower head 350 (see reference numeral F3 of FIG. 2) may be collected and mixed.

The radicals (F*, $NF_3$*, etc.) in the second space 302, the first reaction gas G2, and the second reaction gas G3 downflow to the processing space 101 through the second through hole 3502 by a pumping operation in the processing space 101 (see reference numeral F4 in FIG. 2). In particular, the second reaction gas G3 upflows into the second space 302 through the second supply port 3504 and then downflows into the processing space 101 through the second through hole 3052.

Meanwhile, the heater ring 360 may be disposed between the ion blocker 340 and the shower head 350 and surround the second space 302. The heater ring 360 is for controlling the temperature of the shower head 350, and is not installed inside the shower head 350. By installing the heater ring 360 outside the shower head 350, the shower head 350 may be slimmed down.

Here, a substrate processing process in the processing space 101 will be described in detail with reference to FIGS. 1 and 4.

Before forming the plasma at time t0, a first reaction gas G2 and a second reaction gas G3 (ammonia gas) are provided in the processing space 101 of the process chamber 100 to form the process atmosphere.

Between time t1 and time t2, a process gas G1 (nitrogen trifluoride) is provided to the first space 301. Then, the high frequency power supply 311 is supplied to the electrode 330 to excite the process gas G1 in the form of plasma in the first space 301. Plasma effluents such as radicals, ions and/or electrons are formed. The ions may be filtered by the ion blocker 340 and the remaining plasma effluent may pass through the ion blocker 340. Plasma effluent (i.e., fluorine-containing radicals (F*, $NF_3$*, etc.)) passing through the ion blocker 340 is provided to the second space 302. In addition, the ion blocker 340 and the shower head 350 provide the first reaction gas G2 (i.e., ammonia gas) and the second reaction gas G3 (i.e., ammonia gas) into the second space 302. Through the second through hole 3502 of the shower head 350, fluorine-containing radicals (F*, $NF_3$*, etc.) in the second space 302, the first reaction gas G2, and the second reaction gas G3 are provided to the processing space 101. In the processing space 101, fluorine-containing radicals (F*, $NF_3$*, etc.) react with ammonia gas ($NH_3$) to form an etchant ($NH_4F^*$ or $NH_4F^* \cdot HF^*$) that can easily react with silicon oxide ($SiO_2$).

$$NH_3 + NF_3^* \rightarrow NH_4F^* \text{ or } NH_4F^* \cdot HF^* \quad \text{(Chemical Formula 1)}$$

Then, the etchant ($NH_4F^*$ or $NH_4F^* \cdot HF^*$) reacts with the surface of the silicon oxide formed on the substrate W. As a result of the reaction, products such as $(NH_4)_2SiF_6$ and $H_2O$ may be formed. Here, $H_2O$ is vapor, and $(NH_4)_2SiF_6$ remains thin on the surface of silicon oxide as a solid. Silicon (Si) in $(NH_4)_2SiF_6$ originates from the exposed silicon oxide, and nitrogen, hydrogen, fluorine, etc. forming the remainder originate from plasma effluent, the first reactant gas G2 and/or the second reactant gas G3. During this reaction process, the temperature of the processing space 101 may be maintained at 20° C. to 100° C.

$$NH_4F^* \text{ or } NH_4F^* \cdot HF^* + SiO_2 \rightarrow (NH_4)_2SiF_6(s) + \text{(Chemical Formula 2)}$$

When the temperature of the support module 200 is 100° C. or higher (e.g., 110° C.), $(NH_4)_2SiF_6$ is sublimated to form a gas.

From time t2 to time t3, the pump is operated to remove by-products. Specifically, since $H_2O$ and the like are vapors, they can be removed by a pump. Raising the temperature of the support module 200 to 100° C. or more (e.g., 110° C.), $(NH_4)_2SiF_6$ is sublimated. Since sublimated $(NH_4)_2SiF_6$ is in a gaseous state, it can be removed by pump operation.

Hereinafter, the ion blocker 340 and the shower head 350 used in the substrate processing apparatus according to some embodiments of the present disclosure will be described in detail with reference to FIGS. 5 to 9.

Figure 5:
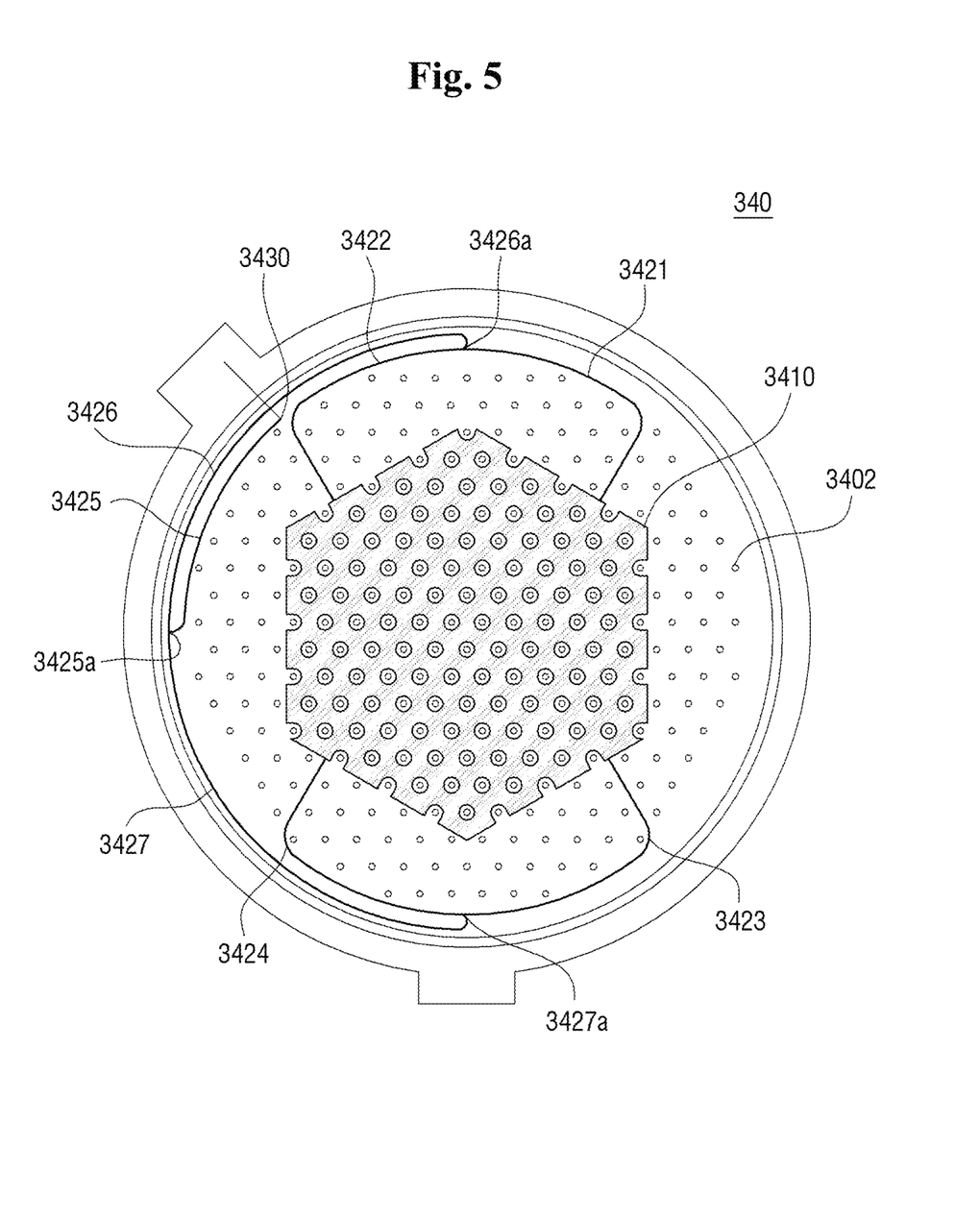
FIG. 5 is a plan view of an ion blocker used in a substrate processing apparatus according to some embodiments of the present disclosure.
Figure 6:
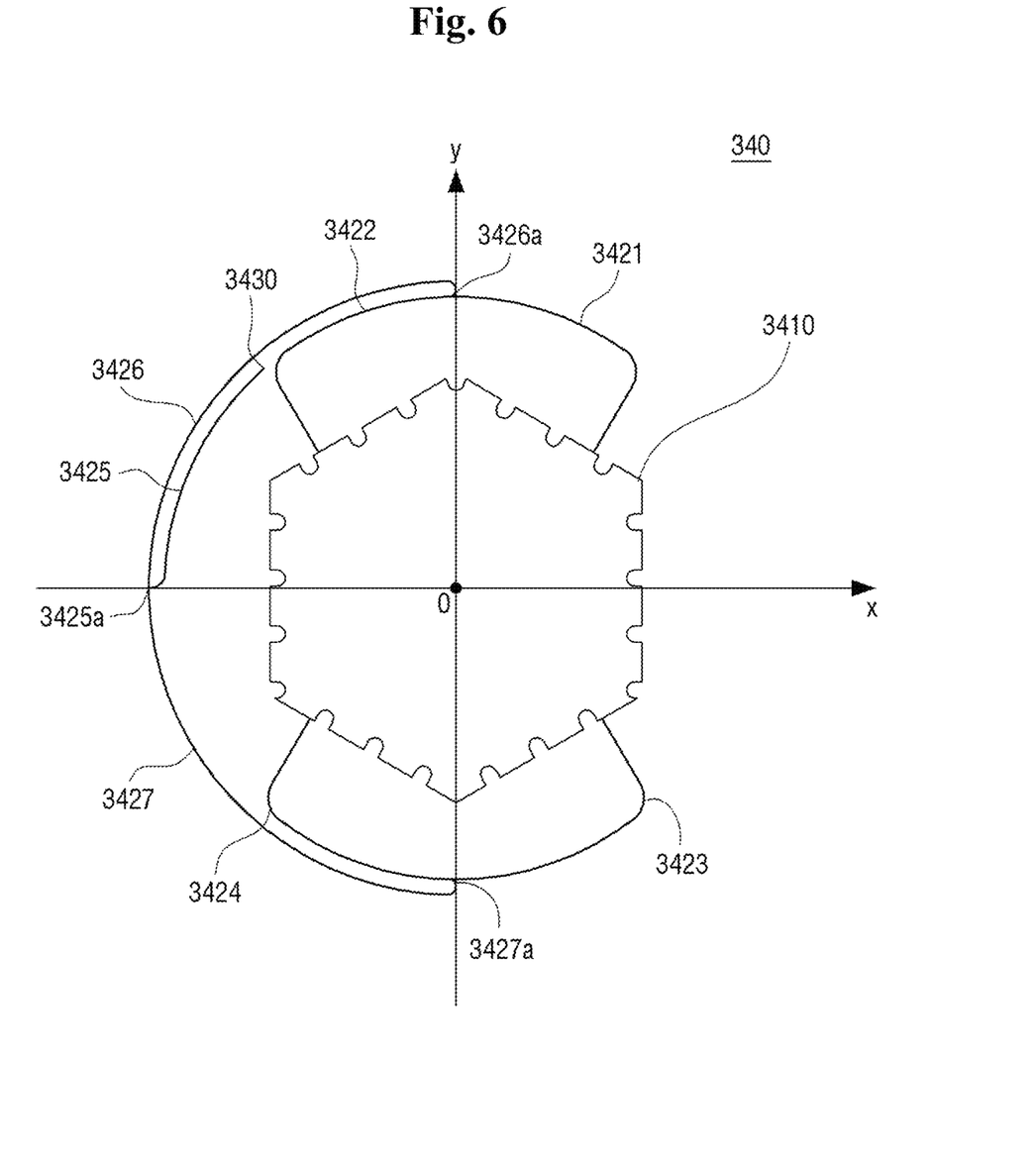
FIG. 6 is a view for describing a first reaction gas supply chamber installed in the ion blocker of FIG. 5.
Figure 7:
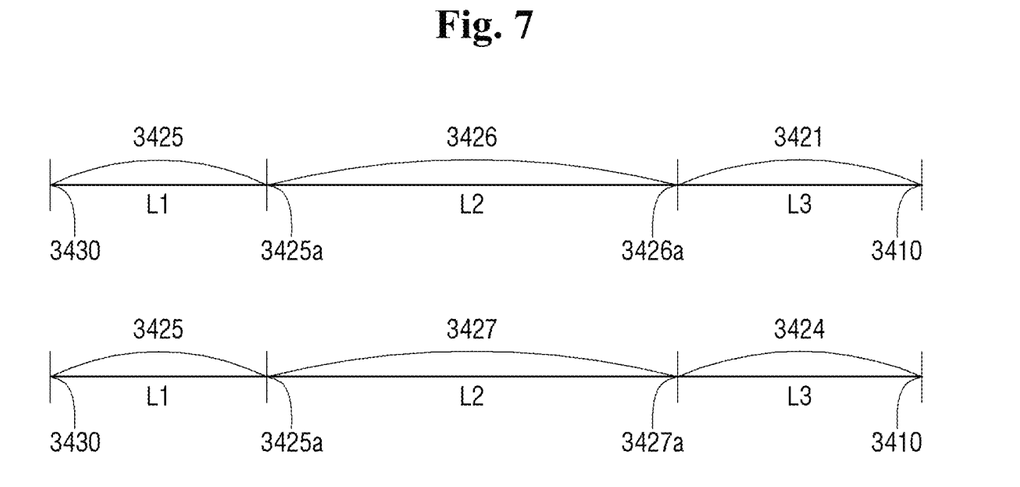
FIG. 7 is a view for describing a first supply path and a first intermediate path of FIG. 6.

FIG. 5 is a plan view of an ion blocker used in a substrate processing apparatus according to some embodiments of the present disclosure. FIG. 6 is a view for describing a first reaction gas supply chamber installed in the ion blocker of FIG. 5. FIG. 7 is a view for describing a first supply path and a first intermediate path of FIG. 6.

First, referring to FIG. 5, in the ion blocker 340, a plurality of first supply ports (3404 in FIG. 2) are formed only in the first region (see 340C in FIG. 3), and are not formed in the second region (340E in FIG. 3). For convenience of illustration, the first supply port 3404 is not shown in FIG. 5.

Ion blocker 340 for implementing this structure comprises a first inlet 3430, at least one first intermediate pass 3425, 3426, 3427, a plurality of first supply paths 3421, 3422, 3423, 3424, a first reaction gas supply chamber 3410, and the like.

The first reaction gas supply chambers 3410 connected to the plurality of first supply ports 3404 are formed only in the first region 340C.

The first reaction gas supply chamber 3410 is connected to a plurality of first supply paths 3421, 3422, 3423, and 3424 for receiving the first reaction gas G2.

The first inlet 3430 is for receiving the first reaction gas G2 from the outside, and at least one first intermediate pass 3425, 3426, 3427 connects a first inlet 3430 and a plurality of first supply paths 3421, 3422, 3423, 3424.

In order for the first reaction gas supply chamber 3410 to uniformly supply the first reaction gas G2 to the second space 302 as a whole, the first reaction gas G2 should be uniformly introduced into the first reaction gas supply chamber 3410 as a whole.

Here, referring to FIG. 6, virtual x-y coordinates having the center (or the center of gravity) of the first reaction gas supply chamber 3410 as the origin are assumed. A plurality of first supply paths 3421, 3422, 3423, 3424 may be symmetrical with respect to the x-axis. That is, the first supply paths 3421 and 3422 disposed above the x-axis (i.e., disposed in the first and second quadrants) may be symmetrical with the first supply paths 3423, 3424 disposed below the x-axis (i.e., disposed in the third and fourth quadrants).

Alternatively, the plurality of first supply paths 3421, 3422, 3423, 3424 may be symmetrical with respect to the y-axis. That is, the first supply paths 3421 and 3423 disposed on the right side of the x-axis (that is, disposed in the first and fourth quadrants) may be symmetrical with the first supply paths 3422, 3424 disposed on the left side of the x-axis (i.e., disposed in the second and third quadrants).

In addition, since the first reaction gas supply chamber 3410 has a substantially hexagonal shape, the first reaction gas supply chamber 3410 is also symmetrical with respect to the x-axis and/or the y-axis.

In addition, the contact portion 3426a where the first intermediate path 3426 and the first supply paths 3421 and 3422 meet each other is disposed on the y-axis. The contact portion 3427a where the first intermediate path 3427 and the first supply paths 3423 and 3424 meet each other is also disposed on the y-axis. The contact portions 3426a and 3427a are also symmetrical with respect to the x-axis.

In addition, the contact portion 3425a where the first intermediate pass 3425 and the other first intermediate passes 3426 and 3427 meet is disposed on the x-axis.

Here, referring to FIG. 7, due to this structure, the lengths of the two intermediate passes 3426 and 3427 are the same as each other (see the length L2).

Accordingly, the path length (L1+L2) from the first inlet 3430 to any one (e.g., 3421) of the plurality of first supply paths is the same as the path lengths (L1+L2) from the first inlet 3430 to another one (e.g., 3424) of the plurality of first supply paths.

The lengths of the plurality of first supply paths 3421, 3422, 3423, and 3424 are the same as each other (see the length L3).

Accordingly, the path length (L1+L2+L3) from the first inlet 3430 to the first reaction gas supply chamber 3410 through any one (e.g., 3421) of the plurality of first supply paths (L1+L2+L3) is the same as the path length (L1+L2+L3) from the first inlet 3430 to the first reaction gas supply chamber 3410 through another one (e.g., 3424) of the plurality of first supply paths.

As described above, all paths for supplying the first reaction gas G2 to the first reaction gas supply chamber 3410 are designed to have the same path length. Accordingly, when the first reaction gas supply module 520 supplies the first reaction gas G2 to the first inlet 3430, the first reaction gas G2 arrives at the first reaction gas supply chamber 3410 through the four first supply paths 3421, 3422, 3423, and 3424 at the same time. Accordingly, the first reaction gas supply chamber 3410 may uniformly supply the first reaction gas G2 to the second space 302 as a whole.

Figure 8:
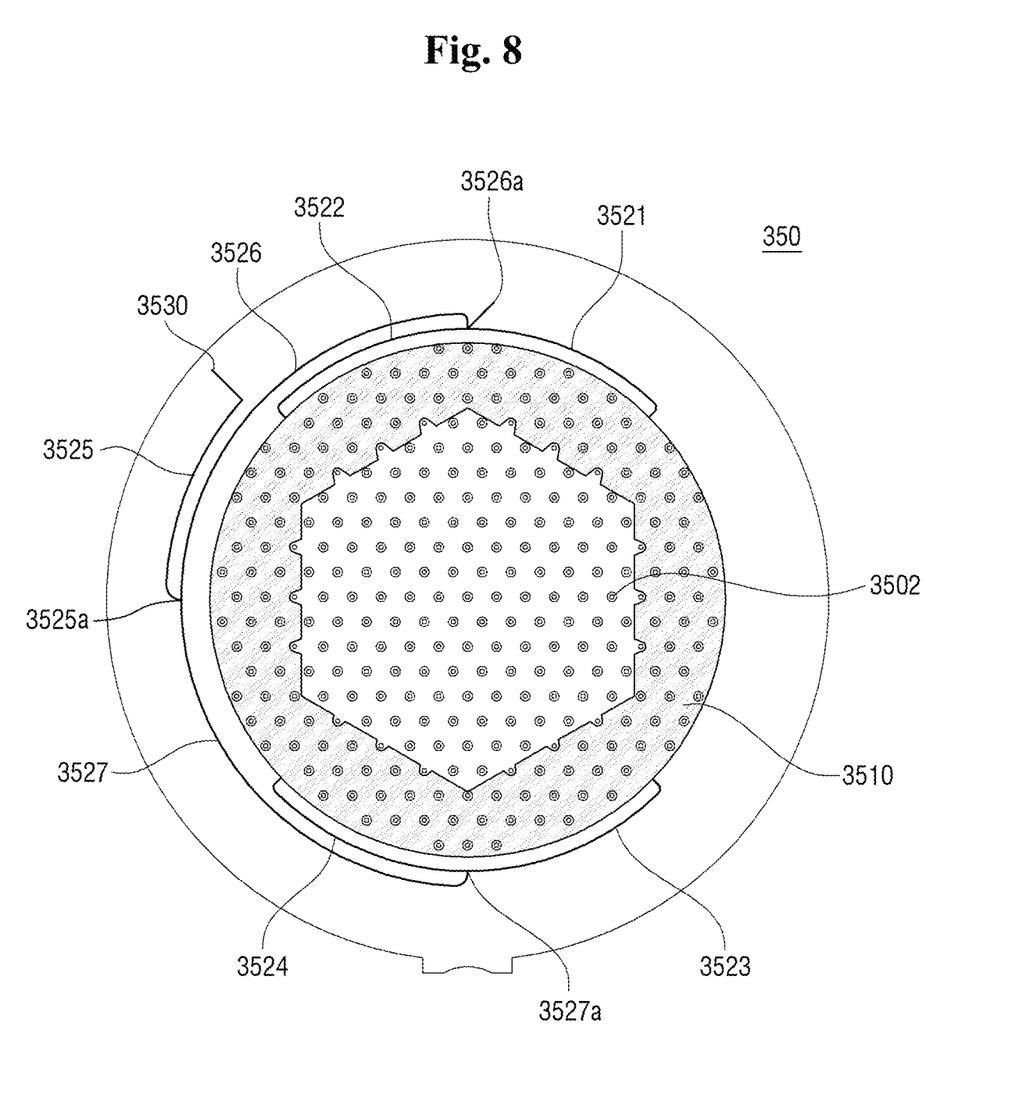
FIG. 8 is a plan view of a shower head used in a substrate processing apparatus according to some embodiments of the present disclosure.
Figure 9:
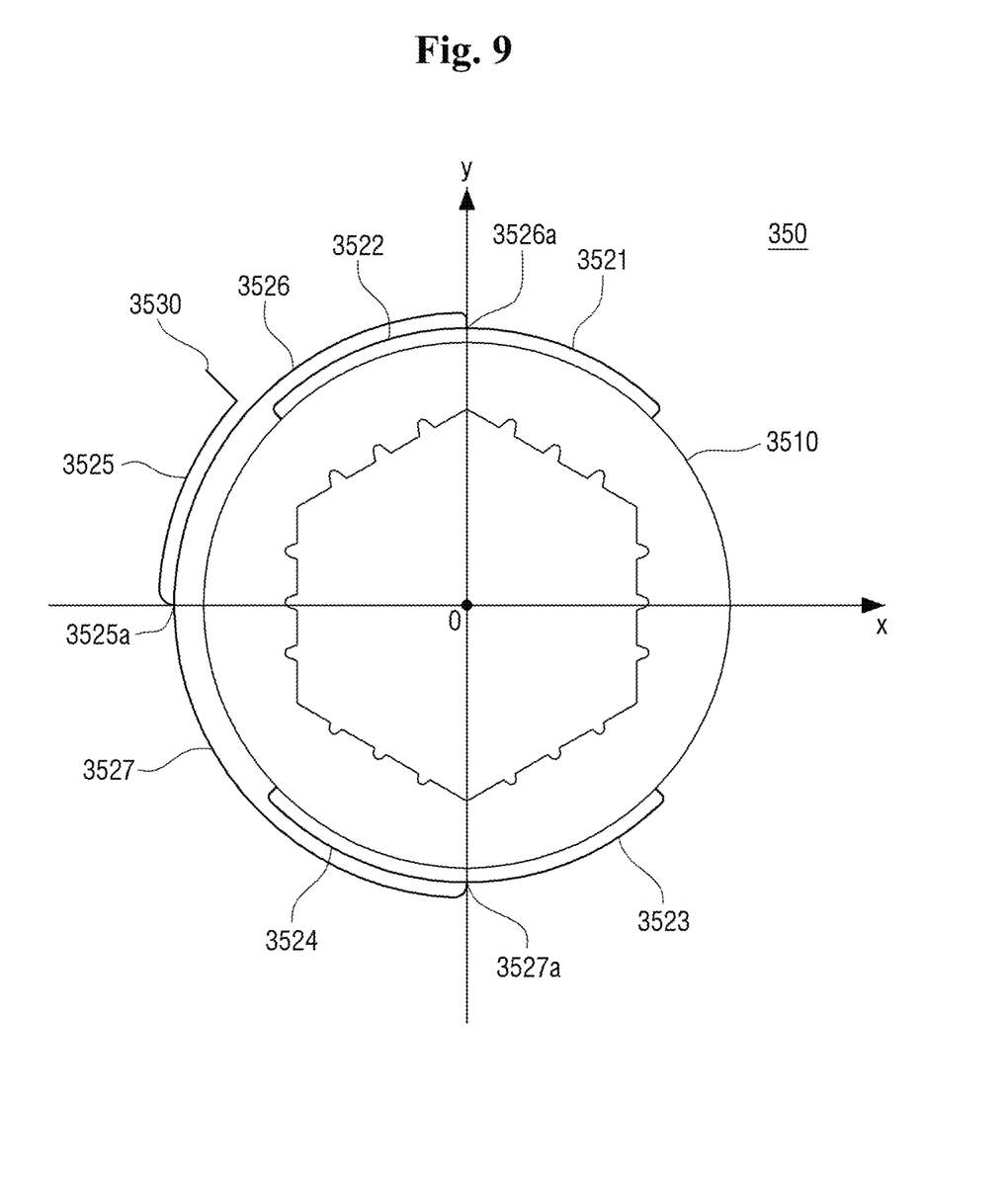
FIG. 9 is a view for describing a second reaction gas supply chamber installed in the shower head of FIG. 8.

FIG. 8 is a plan view of a shower head used in a substrate processing apparatus according to some embodiments of the present disclosure. FIG. 9 is a view for describing a second reaction gas supply chamber installed in the shower head of FIG. 8.

First, referring to FIG. 8, in the shower head 350, the plurality of second supply ports (3504 in FIG. 2) are formed only in the fourth region (see 350E in FIG. 3), and are not formed in the third region (350C in FIG. 3). For convenience of illustration, the second supply port 3504 is not shown in FIG. 8.

The shower head 350 for implementing this structure comprises a second inlet 3530, at least one second intermediate pass 3525, 3526, 3527, a plurality of second supply paths 3521, 3522, 3523, 3524, and a second reaction gas supply chamber 3510 and the like.

The second reaction gas supply chambers 3510 connected to the plurality of second supply ports 3504 are formed only in the fourth region 350E.

The second reaction gas supply chamber 3510 is connected to a plurality of second supply paths 3521, 3522, 3523, and 3524 for receiving the second reaction gas G3.

The second inlet 3530 is for receiving the second reaction gas G3 from the outside, and at least one second intermediate pass 3525, 3526, 3527 connects the first inlet 3530 and a plurality of second supply paths 3521, 3522, 3523, 3524.

In order for the second reaction gas supply chamber 3510 to uniformly supply the second reaction gas G3 to the second space 302 as a whole, the second reaction gas G3 should be uniformly introduced to the second reaction gas supply chamber 3510 as a whole.

Here, referring to FIG. 9, a virtual x-y coordinate having the center (or center of gravity) of the second reaction gas supply chamber 3510 as an origin is assumed. The plurality of second supply paths 3521, 3522, 3523, and 3524 may be symmetrical with respect to the x-axis. That is, the second supply paths 3521 and 3522 disposed above the x-axis (that is, disposed in the first and second quadrants) may be symmetrical with the second supply paths 3523 and 3524 disposed below the x-axis (i.e., disposed in the third and fourth quadrants).

Alternatively, the plurality of second supply paths 3521, 3522, 3523, and 3524 may be symmetrical with respect to the y-axis. That is, the second supply paths 3521 and 3523 disposed on the right side of the x-axis (i.e., disposed in the first and fourth quadrants) may be symmetrical with the second supply paths 3522 and 3524 disposed on the left side of the x-axis (i.e., disposed in the second and third quadrants).

In addition, since the second reaction gas supply chamber 3510 has a tube shape on the outside and a hexagon shape on the inside, the second reaction gas supply chamber 3510 is also symmetrical with respect to the x-axis and/or the y-axis.

In addition, the contact portion 3526a where the second intermediate path 3526 and the second supply paths 3521 and 3522 meet each other is disposed on the y-axis. the contact portion 3527a where the second intermediate path 3527 and the second supply paths 3523 and 3524 meet each other is also disposed on the y-axis. The contact portions 3526a and 3527a are also symmetrical with respect to the x-axis.

In addition, the contact portion 3525a where the second intermediate pass 3525 and other second intermediate passes 3526 and 3527 meet is disposed on the x-axis.

Due to this structure, the lengths of the two intermediate passes 3526 and 3527 are the same as each other.

Accordingly, the path length from the second inlet 3530 to any one (e.g., 3521) of the plurality of second supply paths is the same as the path length from the second inlet 3530 to another one (e.g., 3524) of the plurality of second supply paths.

The lengths of the plurality of second supply paths 3521, 3522, 3523, and 3524 are the same as each other.

Accordingly, the path length from the second inlet 3530 to the second reaction gas supply chamber 3510 through any one (e.g., 3521) of the plurality of second supply paths is the same as the path length from the second inlet 3530 to the second reaction gas supply chamber 3510 through another one (e.g., 3524) of the plurality of second supply paths.

As described above, all paths for supplying the second reaction gas G3 to the second reaction gas supply chamber 3510 are designed to have the same path length. Accordingly, when the second reaction gas supply module 530 supplies the second reaction gas G3 to the second inlet 3530, the second reaction gas G3 arrives at the second reaction gas supply chamber 3510 through the four second supply paths 3521, 3522, 3523, 3524 at the same time. Accordingly, the second reaction gas supply chamber 3510 may uniformly supply the second reaction gas G3 to the second space 302 as a whole.

In addition, the number of first supply paths 3421, 3422, 3423, and 3424 of the ion blocker 340 and the number of second supply paths 3521, 3522, 3523, 3524 of the shower head 350 may be the same as each other.

Referring to FIGS. 1 to 9, in the substrate processing apparatus according to some embodiments of the present disclosure, the first region 340C (e.g., the center region) of the ion blocker 340 supplies a first reaction gas G2 to the second space 302, and the fourth region 350E (e.g., an edge region) of the shower head 350 supplies a second reaction gas G3 to the second space 302. To this end, the first reaction gas supply chamber 3410 is installed inside the first region 340C of the ion blocker 340, and the second reaction gas supply chamber 3510 is installed inside the fourth region 350E of the shower head 350.

In order to increase the uniformity of substrate processing and control the process in the center region and edge region of the substrate, for example, the shower head may be divided into two zones (center region, edge region) to supply reaction gas. That is, the reaction gas supply chamber may be installed in each of the center region and the edge region of the shower head 350. However, in this case, a partition wall should exist between the reaction gas supply chamber formed in the center region and the reaction gas supply chamber formed in the edge region. Due to the partition wall, gas stagnant zones can be generated and particles can be generated. In addition, a plurality of supply paths (e.g., four supply paths) may be installed in the reaction gas supply chamber formed in the edge region, but relatively few supply paths (e.g., one supply path) should be installed in the reaction gas supply chamber formed in the center region. Accordingly, the flow uniformity of the reaction gas in the center region is inevitably deteriorated.

On the other hand, according to the substrate processing apparatus according to some embodiments of the present disclosure, since the first reaction gas supply chamber 3410 is installed inside the first region 340C of the ion blocker 340, and the second reaction gas supply chamber 3510 is installed inside the fourth region 350E of the shower head 350, there is no partition wall separating the first reaction gas supply chamber 3410 and the second reaction gas supply chamber 3510. Therefore, there is no gas stagnant section due to the presence of the partition wall, and generation of particles can be minimized.

Even when the cross-sections of the ion blocker 340 and the shower head 350 are viewed, the first reaction gas supply chamber 3410 and the second reaction gas supply chamber 3510 may partially overlap in the vertical direction. That is, if the first reaction gas supply chamber 3410 in FIG. 5 is further extended in the edge direction and the second reaction gas supply chamber 3510 in FIG. 8 is further expanded in the center direction, it can be the vertically overlapped state.

In addition, the shower head 350 does not supply the second reaction gas G3 to the processing space 101, but supplies the second reaction gas G3 to the second space 302. However, if the shower head 350 supplies the second reaction gas G3 to the processing space 101, the supply port should be formed in the processing space 101 direction. A coating layer for protecting the shower head 350 is formed on the bottom surface of the shower head 350, and the coating layer also should be formed around and inside the supply port. Since the size of the supply port is small, the coating layer may be defectively formed around and inside the supply port. In some embodiments of the present disclosure, since the second supply port 3504 of the shower head 350 does not face the processing space 101 but faces the second space 302, the above-described defect can be prevented.

Although embodiments of the present disclosure have been described with reference to the above and the accompanying drawings, those skilled in the art, to which the present disclosure pertains, can understand that the present disclosure may be practiced in other specific forms without changing its technical spirit or essential features. Therefore, it should be understood that the embodiments described above are illustrative in all respects and not limiting.

What is claimed is:

1. An apparatus for processing a substrate comprising:
a first space disposed between an electrode and an ion blocker;
a second space disposed between the ion blocker and a shower head; and
a processing space for processing a substrate under the shower head,
wherein the ion blocker includes a center region located at a center of the ion blocker and a periphery region surrounding the center region, the center region and the periphery region are separated from each other, and the ion blocker includes a plurality of first supply ports for supplying a first reaction gas to the second space,
wherein the plurality of first supply ports are formed in the first center region of the ion blocker and not formed in the periphery region of the ion blocker, wherein the shower head includes a center region located at a center of the shower head and corresponding to the center region of the ion blocker, a periphery region surrounding the center region of the shower head and corresponding to the periphery region of the ion blocker, and a plurality of second supply ports for supplying a second reaction gas to the second space, wherein the plurality of second supply ports are not formed in the center region of the shower head, and are formed in the periphery region of the shower head.

2. The apparatus of claim 1, wherein radicals in plasma generated in the first space pass through the ion blocker and are provided to the second space, and the radicals, the first reaction gas and the second reaction gas downflow from the second space to the processing space through a pumping operation in the processing space.

3. The apparatus of claim 1, wherein a first reaction gas supply chamber connected to the plurality of first supply ports is installed in the center region of the ion blocker, and the first reaction gas supply chamber is connected to a plurality of first supply paths for receiving the first reaction gas.

4. The apparatus of claim 3, wherein the plurality of first supply paths are symmetrical with respect to an x-axis in virtual x-y coordinates having a center of the first reaction gas supply chamber as an origin.

5. The apparatus of claim 3, wherein the ion blocker further comprises a first inlet for receiving the first reaction gas from an outside, and at least one first intermediate pass for connecting the first inlet and the plurality of first supply paths.

6. The apparatus of claim 5, wherein lengths of the plurality of first supply paths are the same as each other, and a first path length from the first inlet to any one of the plurality of first supply paths is the same as a second path length from the first inlet to another one of the plurality of first supply paths.

7. The apparatus of claim 3, wherein a second reaction gas supply chamber connected to the plurality of second supply ports is installed in the periphery region of the shower head, and the second reaction gas supply chamber is connected to a plurality of second supply paths for receiving a second reaction gas,
wherein the number of the first supply paths and the number of the second supply paths are the same as each other.

8. The apparatus of claim 1, wherein a second reaction gas supply chamber connected to the plurality of second supply ports is installed in the periphery region of the shower head, and the second reaction gas supply chamber is connected to a plurality of second supply paths for receiving a second reaction gas.

9. The apparatus of claim 8, wherein the plurality of second supply paths are symmetrical with respect to an x-axis in virtual x-y coordinates having a center of the second reaction gas supply chamber as an origin.

10. The apparatus of claim 8, wherein the shower head further comprises a second inlet for receiving a second reaction gas from an outside, and at least one second intermediate pass for connecting the second inlet and a plurality of second supply paths.

11. The apparatus of claim 10, wherein lengths of the plurality of second supply paths are the same as each other, wherein a third path length from the second inlet to any one of the plurality of second supply paths is the same as a fourth pass length from the second inlet to another one of the plurality of second supply paths.

12. The apparatus of claim 1 further comprises, a heater ring disposed between the ion blocker and the shower head and surrounding the second space.

13. The apparatus of claim 1, wherein a first reaction gas supply chamber connected to the plurality of first supply ports is installed in the center region of the ion blocker,
wherein a second reaction gas supply chamber connected to the plurality of second supply ports is installed in the periphery region of the shower head,
wherein, when cross-sections of the ion blocker and the shower head are viewed, the first reaction gas supply chamber and the second reaction gas supply chamber partially overlap in a vertical direction.

14. The apparatus of claim 1, wherein a coating layer for protecting the shower head is formed on a lower surface of the shower head.

15. An apparatus for processing a substrate comprising:
a first space disposed between an electrode and an ion blocker;
a second space disposed between the ion blocker and a shower head; and
a processing space for processing a substrate under the shower head,
wherein a first reaction gas supply chamber connected to a plurality of first supply ports for supplying a first reaction gas to the second space is installed in a center region of the ion blocker,
wherein a second reaction gas supply chamber connected to a plurality of second supply ports for supplying a second reaction gas to the second space is installed in an edge region of the shower head,
wherein a heater ring disposed between the ion blocker and the shower head, and surrounding the second space is installed,
wherein the first reaction gas supply chamber is connected to a plurality of first supply paths for receiving the first reaction gas,
wherein the second reaction gas supply chamber is connected to a plurality of second supply paths for receiving the second reaction gas.

16. The apparatus of claim 15, wherein the ion blocker further comprises a first inlet for receiving a first reaction gas from an outside, and at least one first intermediate pass for connecting the first inlet and a plurality of first supply paths,
wherein lengths of the plurality of first supply paths are the same as each other,
wherein a first path length from the first inlet to any one of the plurality of first supply paths is the same as a second path length from the first inlet to another one of the plurality of first supply paths.

17. The apparatus of claim 15, wherein the number of the plurality of first supply paths and the number of the plurality of second supply paths are the same as each other.

18. An apparatus for processing a substrate comprising:
a first space disposed between an electrode and an ion blocker;
a second space disposed between the ion blocker and a shower head;
a processing space for processing a substrate under the shower head;
a first gas supply module for providing a process gas for generating plasma to the first space through the electrode;
supply ports installed at the ion blocker and configured to provide a first reaction gas to the second space; and other supply ports installed at the shower head and configured to provide a second reaction gas to the second space, wherein none of the supply ports installed at the ion blocker is aligned with any one of the other supply ports installed at the shower head.

19. The apparatus of claim 18, wherein radicals in plasma generated in the first space pass through the ion blocker and are provided to the second space, and the radicals, the first reaction gas, and the second reaction gas downflow from the second space to the processing space through a pumping operation in the processing space.

\* \* \* \* \*